(12) United States Patent
Lin et al.

(10) Patent No.: US 10,773,953 B2
(45) Date of Patent: Sep. 15, 2020

(54) MEMS STRUCTURE AND METHOD OF FABRICATING THE SAME

(71) Applicant: UNITED MICROELECTRONICS CORP., Hsin-Chu (TW)

(72) Inventors: Meng-Jia Lin, Changhua County (TW); Yung-Hsiao Lee, Hsinchu County (TW); Weng-Yi Chen, Hsinchu County (TW); Shih-Wei Li, Taoyuan (TW); Chung-Hsien Liu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 100 days.

(21) Appl. No.: 15/697,467

(22) Filed: Sep. 7, 2017

(65) Prior Publication Data
US 2017/0362081 A1     Dec. 21, 2017

Related U.S. Application Data

(62) Division of application No. 14/993,105, filed on Jan. 12, 2016, now Pat. No. 9,790,088.

(30) Foreign Application Priority Data

Dec. 10, 2015  (CN) .......................... 2015 1 0908759

(51) Int. Cl.
*B81C 1/00* (2006.01)
*B81B 7/00* (2006.01)

(52) U.S. Cl.
CPC .......... *B81C 1/00246* (2013.01); *B81B 7/008* (2013.01); *B81C 1/00571* (2013.01); *B81B 2201/0235* (2013.01); *B81B 2201/0285* (2013.01); *B81B 2203/0315* (2013.01); *B81B 2207/012* (2013.01); *B81B 2207/015* (2013.01); *B81C 2201/014* (2013.01); *B81C 2201/0132* (2013.01)

(58) Field of Classification Search
CPC .......... B81C 1/00246; B81C 1/00047–00087; B81B 2001/0285; B81B 2203/0315–0353; B81B 2201/0285; B81B 2207/012; B81B 2207/015; H01L 2924/1461
See application file for complete search history.

(56) References Cited

U.S. PATENT DOCUMENTS

| 6,936,524 B2 | 8/2005 | Zhu |
| 7,049,051 B2 | 5/2006 | Gabriel |
| 7,615,426 B2 | 11/2009 | Wang |

(Continued)

*Primary Examiner* — Monica D Harrison
*Assistant Examiner* — John Lin
(74) *Attorney, Agent, or Firm* — Winston Hsu

(57) ABSTRACT

A method of fabricating a MEMS structure includes providing a substrate comprising a logic element region and a MEMS region. Next, a logic element is formed within the logic element region. A nitrogen-containing material layer is formed to cover the logic element region and the MEMS region conformally. Then, part of the nitrogen-containing material layer within the MEMS region is removed to form at least one shrinking region. Subsequently, a dielectric layer is formed to cover the logic element region and MEMS region, and the dielectric layer fills in the shrinking region. After that, the dielectric layer is etched to form at least one releasing hole, wherein the shrinking region surrounds the releasing hole. Finally, the substrate is etched to form a chamber.

10 Claims, 7 Drawing Sheets

(56) References Cited

U.S. PATENT DOCUMENTS

| | | |
|---|---|---|
| 2009/0215277 A1 | 8/2009 | Lee |
| 2010/0213557 A1* | 8/2010 | Wang .................. B81C 1/00246 257/417 |
| 2010/0224766 A1 | 9/2010 | Tateshita |
| 2011/0189804 A1 | 8/2011 | Huang |
| 2012/0139050 A1 | 6/2012 | Yang |
| 2013/0023081 A1 | 1/2013 | Lin |
| 2013/0161702 A1* | 6/2013 | Chen .................. B81C 1/00246 257/254 |
| 2013/0270651 A1 | 10/2013 | Chung |

* cited by examiner

MEMS STRUCTURE AND METHOD OF FABRICATING THE SAME

CROSS REFERENCE TO RELATED APPLICATIONS

This patent application is a divisional application of and claims priority to U.S. patent application Ser. No. 14/993, 105, filed on Jan. 12, 2016, and entitled "MEMS STRUCTURE AND METHOD OF FABRICATING THE SAME" the entire contents of which are incorporated herein by reference.

BACKGROUND OF THE INVENTION

1. Field of the Invention

The present invention relates to a MEMS (micro electro mechanical systems) structure, and more particularly to a MEMS structure having a shrinking region, and a method of fabricating the same.

2. Description of the Prior Art

MEMS is the technology of the very small. MEMS devices are made up of components between 10 to 100 micrometers in size and generally range in size from 20 micrometers to a millimeter. MEMS include a central unit that processes data, as well as a microprocessor and several components that interact with the outside. MEMS are practical because they are fabricated using modified semiconductor fabrication technologies, which are normally used to make electronics. These fabrication technologies include molding and plating, wet etching and dry etching (RIE and DRIE), electro discharge machining, and other technologies capable of manufacturing very small devices.

Basic production techniques for producing silicon-based MEMS devices include deposition of material layers, patterning of layers by photolithography and/or etching to produce patterns and desired shapes. When etching the substrate to form a cavity, the etchant sometimes etches an unexpected region. Therefore, unwanted gaps are formed, and the MEMS devices easily collapse.

In view of the above, it would be an advantage in the art to provide a MEMS structure which is not subject to unwanted gaps.

SUMMARY OF THE INVENTION

According to a first preferred embodiment of the present invention, a method of fabricating a MEMS structure includes providing a substrate comprising a logic element region and a MEMS region. A logic element is formed within the logic element region. Then, a nitrogen-containing material layer is formed to cover the logic element region and the MEMS region. Subsequently, part of the nitrogen-containing material layer within the MEMS region is removed to form at least one shrinking region in the nitrogen-containing material layer. Next, a dielectric layer is formed to cover the logic element region and the MEMS region, wherein the dielectric layer fills in the shrinking region. Subsequently, the dielectric layer is etched to form at least one releasing hole, wherein the shrinking region surrounds the releasing hole. Finally, the substrate is etched to form a chamber, wherein the chamber and the releasing hole form a vibration chamber.

According to another preferred embodiment of the present invention, a MEMS structure includes: a substrate comprising a logic element region and a MEMS region, a logic element disposed within the logic element region; a nitrogen-containing material layer covering the logic element, the logic element region and the MEMS region, wherein at least one shrinking region is defined in the nitrogen-containing material layer, and there is no nitrogen-containing material layer inside the shrinking region, a dielectric layer covering the logic element region and the MEMS region, the dielectric layer filling in the shrinking region, and at least one releasing hole disposed inside the dielectric layer within the shrinking region, wherein the shrinking region surrounds the releasing hole and a chamber disposed in the substrate within the MEMS region, wherein the chamber and the releasing hole form a vibration chamber.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a method of fabricating a MEMS structure according to a first preferred embodiment of the present invention, wherein:

FIG. 2 is a fabricating stage following FIG. 1;
FIG. 4 is a fabricating stage following FIG. 3B;
FIG. 6 is a fabricating stage following FIG. 5B.

DETAILED DESCRIPTION

FIG. 1 to FIG. 6 depict a method of fabricating a MEMS structure according to a first preferred embodiment of the present invention.

Figure 1:
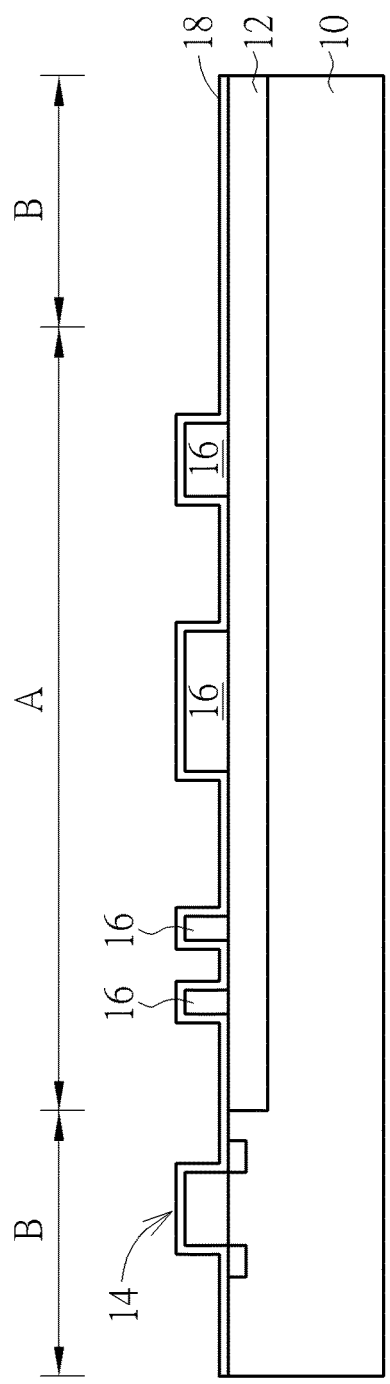

As shown in FIG. 1, a substrate 10 is provided. The substrate 10 includes a MEMS region A and two logic element regions B. The two logic element regions B can be disposed at two sides of the MEMS region A. The substrate 10 may be a bulk silicon substrate, a germanium substrate, a gallium arsenide substrate, a silicon germanium substrate, an indium phosphide substrate, a gallium nitride substrate, a silicon carbide substrate or other semiconductive substrates. In this embodiment, the substrate 10 is preferably silicon substrate. An STI (shallow trench isolation) 12 may be disposed on the substrate 10 within the MEMS region A. The STI 12 may extend into the logic element region B. Next, a logic element 14 such as a transistor is formed within one of the logic regions B. At least one MEMS element 16 is formed within the MEMS region A. The transistor may include a polysilicon gate electrode. The MEMS element 16 may include polysilicon. There are four MEMS elements 16 shown in FIG. 1, but the number of the MEMS element 16 can be adjusted according to the requirements of the products. Then, an etching stop layer 18 is formed to conformally cover the MEMS region A and logic element regions B. In detail, the etching stop layer 18 covers the substrate 10, the logic element 14 and the MEMS elements 16. The etching stop layer 18 is preferably silicon nitride, but not limited thereto. The etching stop layer 18 may be other nitrogen-containing material layers. Moreover, the etching stop layer 18 can be multiple material layers including at least one nitrogen-containing material layer. For example, the etching stop layer 18 may be a combination of silicon nitride and silicon oxide. Furthermore, there may be stress in the etching stop layer 18 which can be imparted to material layers below.

Figure 2:
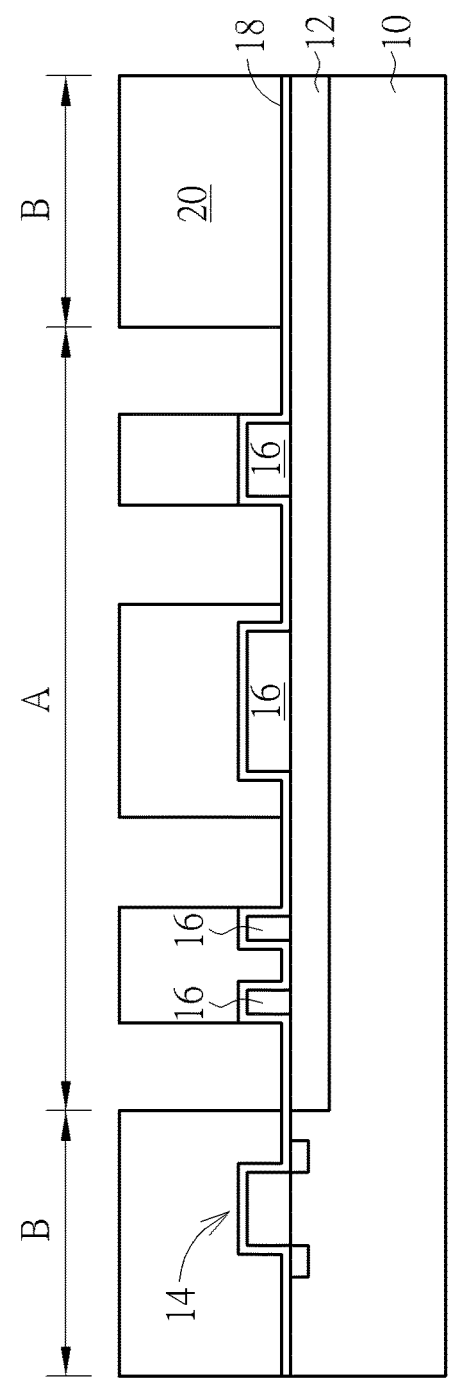
Figure 3A:
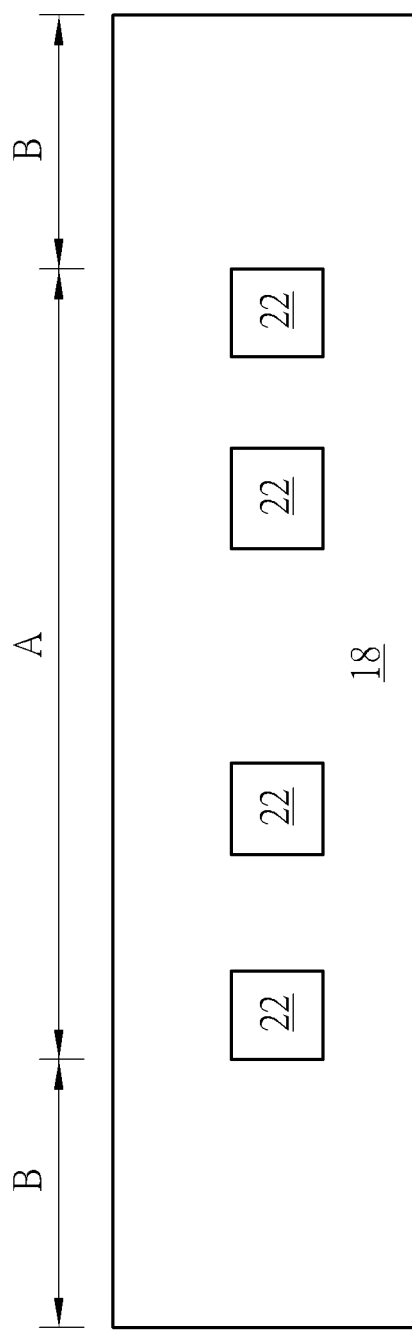
FIG. 3A shows a top view of relative positions of an etching stop layer and a shrinking region.
Figure 3B:
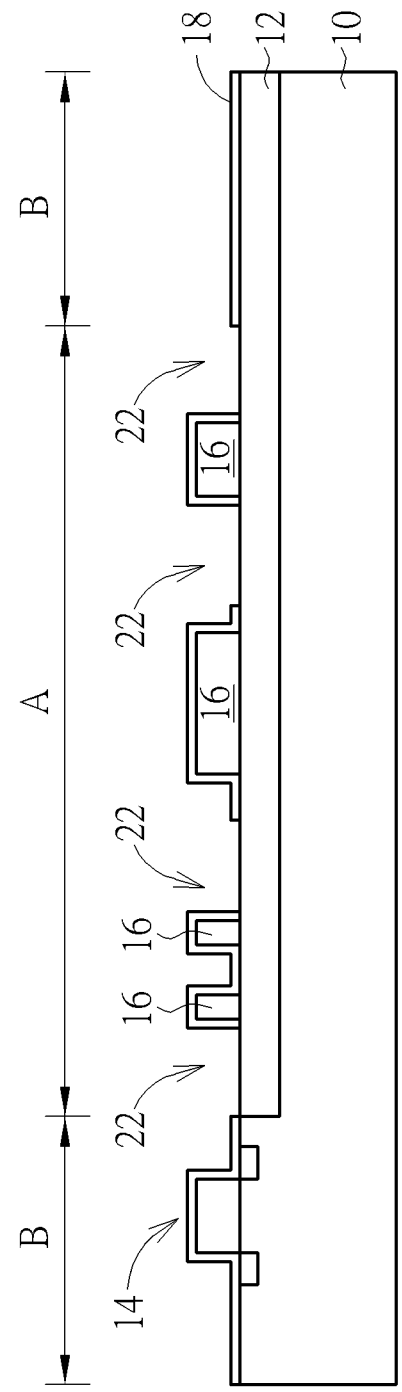
FIG. 3B is a fabricating stage following FIG. 2.

As shown in FIG. 2, a patterned photoresist layer 20 is formed to cover the etching stop layer 18. Part of the etching stop layer within the MEMS region A is exposed through the patterned photoresist layer 20. FIG. 3B is a fabricating stage following FIG. 2. FIG. 3A shows a top view of relative positions of an etching stop layer and a shrinking region. Please refer to FIG. 3A and FIG. 3B. The nitrogen-containing material layer of the exposed etching stop layer 18 is removed by taking the patterned photoresist layer 20 as a mask layer. Therefore, a shrinking region 22 is defined in the etching stop layer 18. In other words, the shrinking region 22 is a region defined by removing part of the etching stop layer 18, and the shrinking region 22 can also be deemed a recess within the etching stop layer 18. Therefore, there is no nitrogen-containing material layer within the shrinking region 22. Specifically, if the etching stop layer 18 is a single layer structure such as a single layer of silicon nitride, there is no etching stop layer 18 within the shrinking region 22. If the etching stop layer 18 is a multi-layered structure formed by a combination of a nitrogen-containing material layer and a non-nitrogen-containing material layer (for example, a combination of silicon nitride and silicon oxide), a non-nitrogen-containing material layer such as silicon oxide will remain after the shrinking region 22 is formed. After the shrinking region 22 is formed, the patterned photoresist layer 20 is removed. The method of removing the etching stop layer 18 may be a dry etching process or a wet etching process. In this embodiment, the etching stop layer 18 takes a single layer structure as an example.

Figure 4:
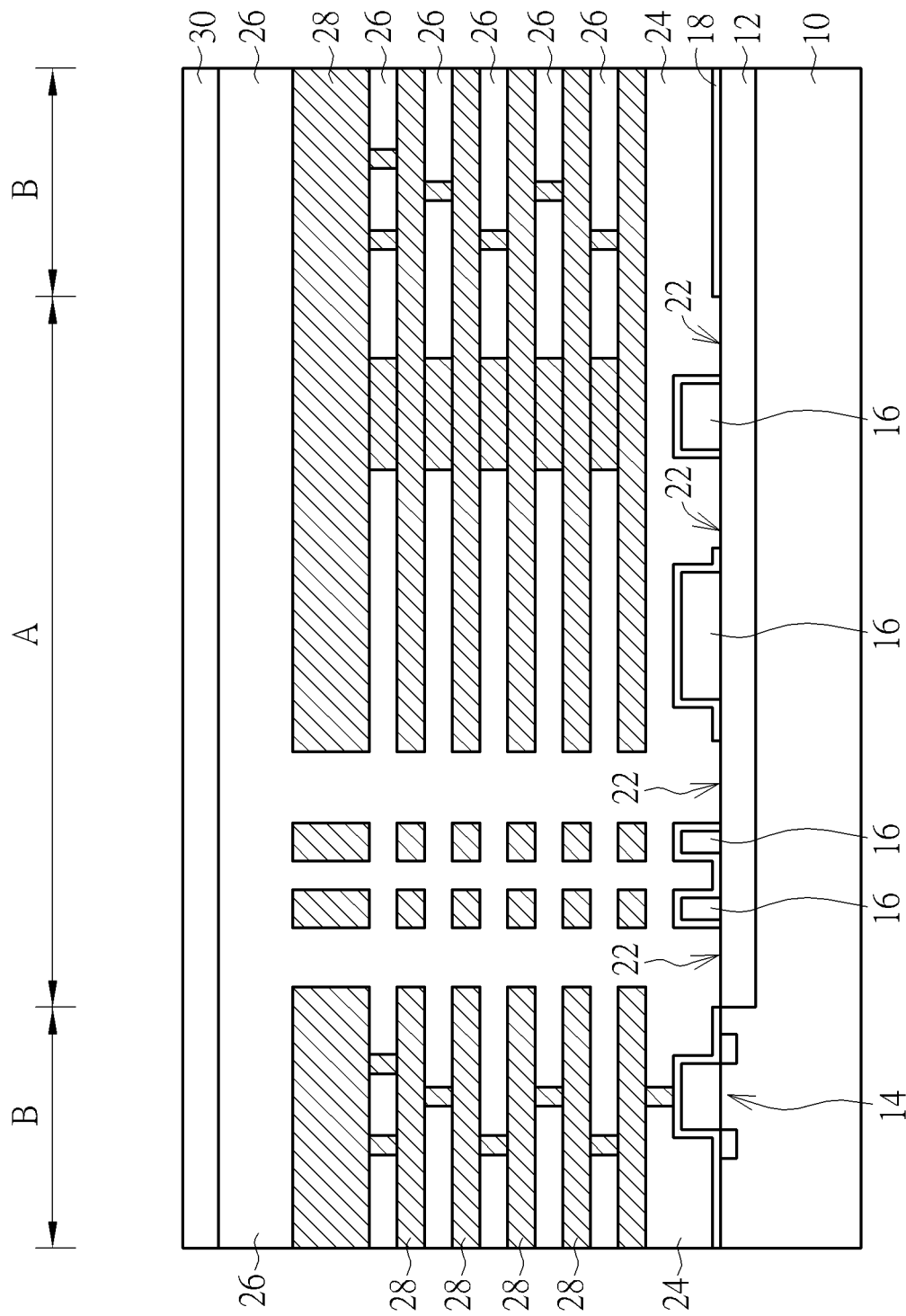

As shown in FIG. 4, at least one dielectric layer 24, numerous inter-metal dielectric layers 26 and numerous metal circuits 28 are formed on the substrate 10 at the MEMS region A and the logic element regions B. The dielectric layer 24 is below the inter-metal dielectric layers 26. The metal circuits 28 are inside the dielectric layer 24 and the inter-metal dielectric layers 26. The inter-metal dielectric layers 26 and the dielectric layer 24 are preferably silicon oxide. The dielectric layer 24 fills up the shrinking region 22 and contacts the etching stop layer 18. Then, a protective layer 30 is optionally formed on the topmost inter-metal dielectric layer 26. The protective layer 30 is preferably silicon oxide.

Figure 5A:
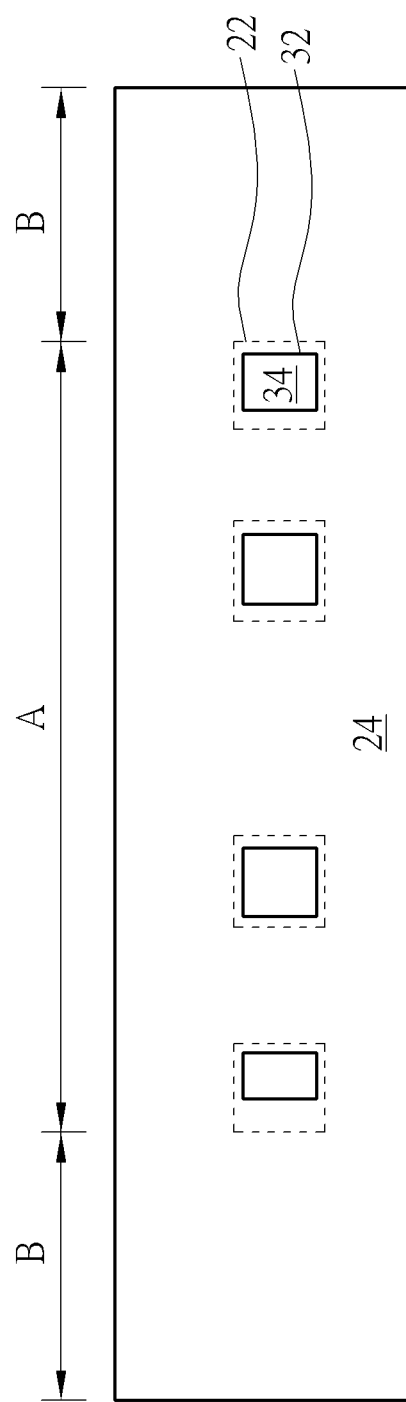
FIG. 5A shows a top view of relative positions of an etching stop layer, a shrinking region and a releasing hole.
Figure 5B:
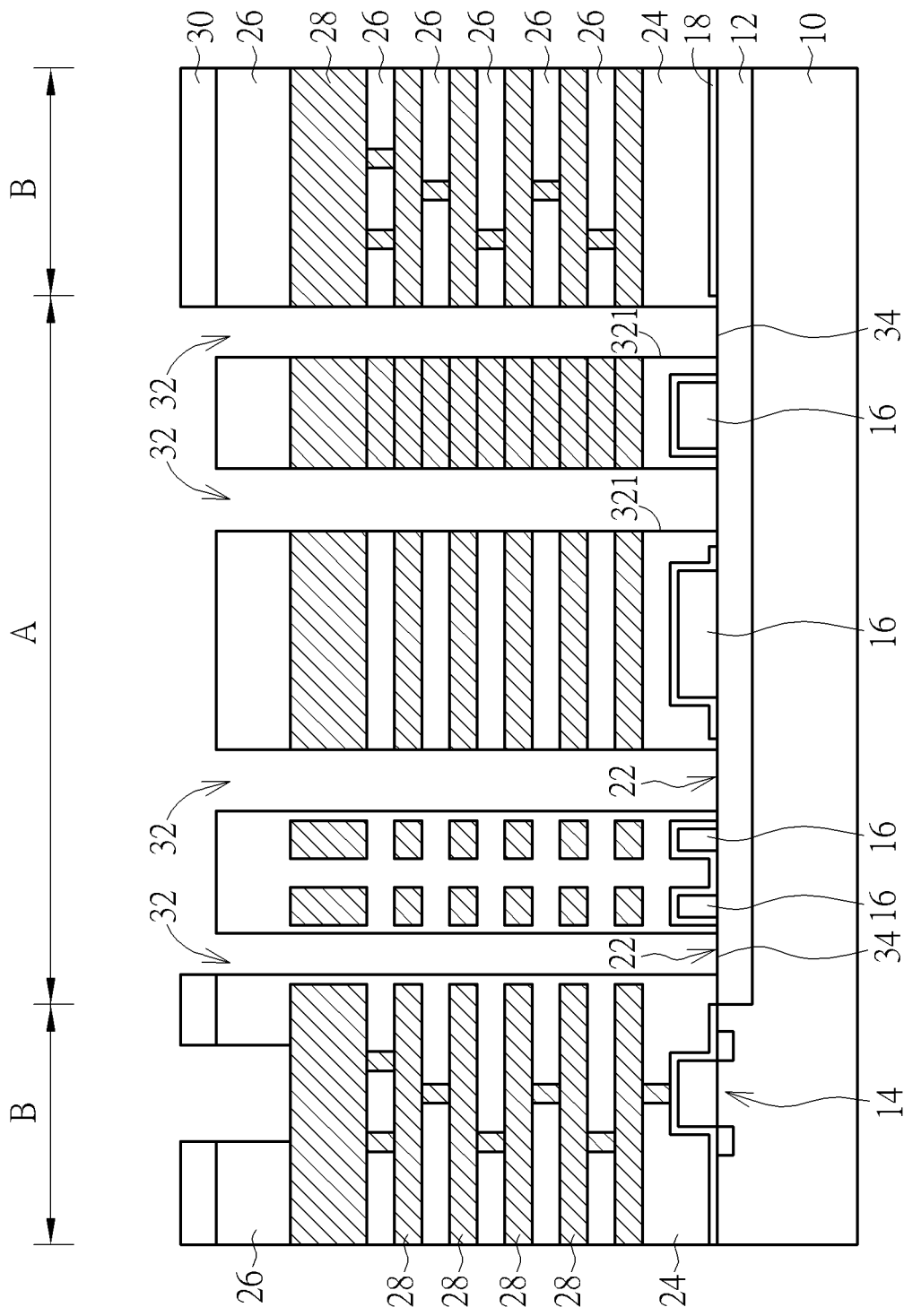
FIG. 5B is a fabricating stage following FIG. 4.

FIG. 5B is a fabricating stage following FIG. 4. FIG. 5A shows a top view of relative positions of an etching stop layer, a shrinking region and a releasing hole. As shown in FIG. 5B, part of the protective layer 30 is removed so as to expose the topmost inter-metal dielectric layer 26 within the MEMS region A and within the logic element regions B. Next, a mask layer (not shown) is formed to cover the exposed topmost inter-metal dielectric layer 26 within the logic element regions B. Then, the topmost inter-metal dielectric layer 26 within the MEMS region A is etched to expose the metal circuits 28 within the inter-metal dielectric layers 26. After that, the mask layer is removed. Subsequently, another mask layer (not shown) is formed to cover the logic element regions B, and expose the MEMS region A. Then, the inter-metal dielectric layers 26, the metal circuits 28 and the dielectric layer 24 within the MEMS region A are etched to form at least one releasing hole 32 penetrating the inter-metal dielectric layers 26, the metal circuits 28 and the dielectric layer 24. The number of the releasing hole 32 may be four as shown in FIG. 5A and FIG. 5B; however, based on different requirements, the number of the releasing hole 32 can be altered.

It is noteworthy that the relative positions of the shrinking region 22 and the releasing hole 32 are designed to make the shrinking region 22 surround and overlap the releasing hole 32. In detail, the releasing hole 32 includes an end 34 disposed in the dielectric layer 24 filling the shrinking region 22. The end 34 is entirely within the shrinking region 22 and overlaps part of the shrinking region 22. The shrinking region 22 which does not overlap the shrinking region 22 surrounds the end 34. The relative positions of the shrinking region 22 and the releasing hole 32 will ensure there is no nitrogen-containing material layer around the releasing hole 32. In other words, when etching the inter-metal dielectric layers 26, the metal circuits 28 and the dielectric layer 24 to form the releasing hole 32, the nitrogen-containing material layer in the etching stop layer 18 is not etched. Moreover, the releasing hole 32 includes a sidewall 321, and there is no nitrogen-containing material layer exposed through the sidewall 321.

Figure 6:
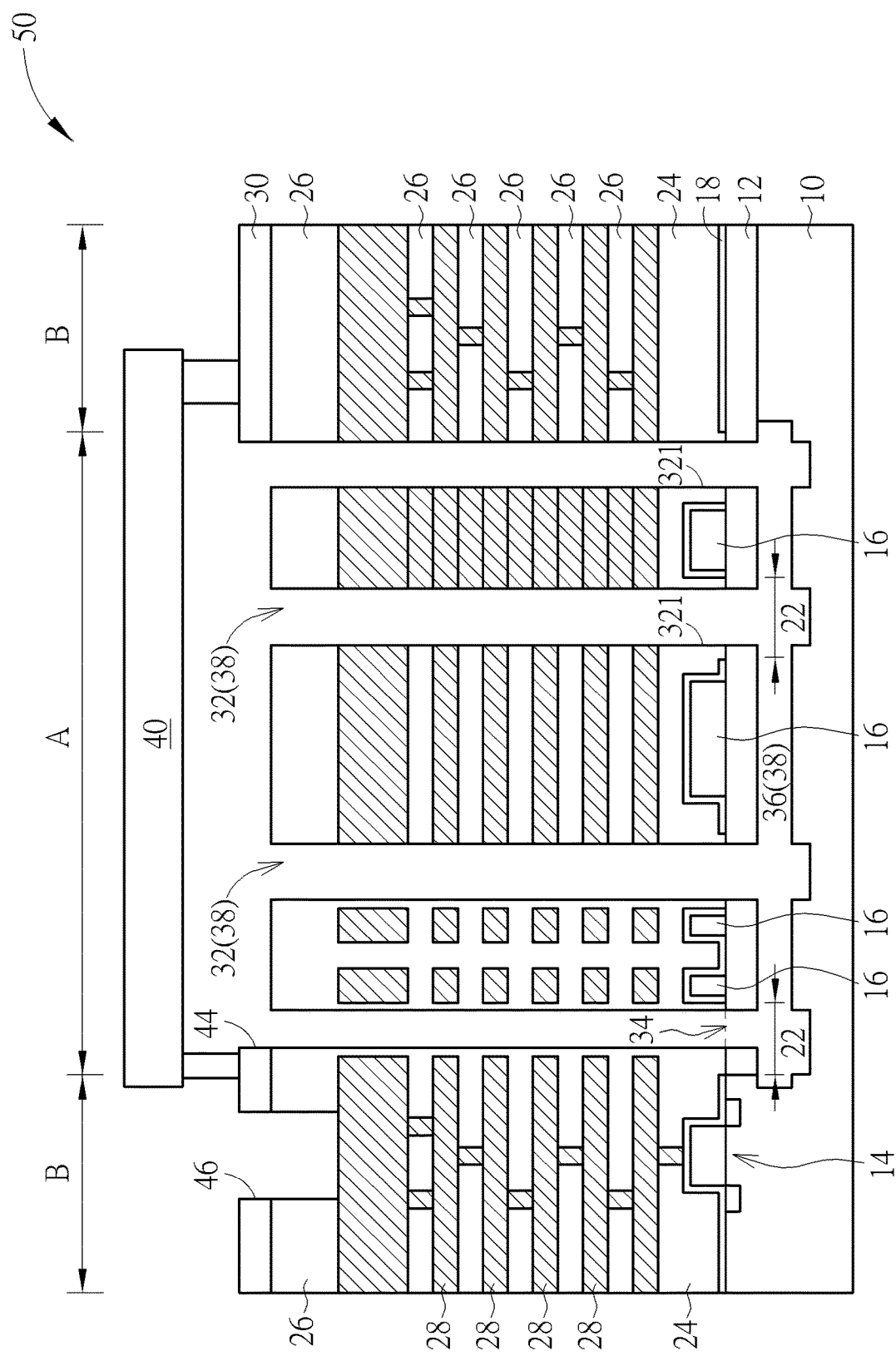

As shown in FIG. 6, after the releasing hole 32 is formed, the substrate 10 below the end 34 is etched to form a chamber 36. Then, the mask layer covering the logic element regions B is removed. If there are numerous releasing holes 32, the chamber 36 connects to all releasing holes 32. The releasing hole 32 is preferably formed by using a deep reactive ion etching process along with a suitable etchant to etch the inter-metal dielectric layers 26, the metal circuits 28 and the dielectric 24. After the releasing hole 32 is formed, the etchant is changed to etch the substrate 10 to form the chamber 36. The etchant used to etch the substrate 10 is preferably sulfur hexafluoride. At this point, the MEMS structure 50 of the present invention is completed. The chamber 36 and the releasing hole 32 comprise a vibration chamber 38 of the MEMS structure 50. It is noteworthy that there is no solid material inside the vibration chamber 38. In addition, a cap layer 40 can optionally be formed within the MEMS region A on the substrate 10 to cover the releasing hole 32 and the chamber 36 for preventing pollutants from falling into the releasing hole 32 and the chamber 36.

Figure 7:
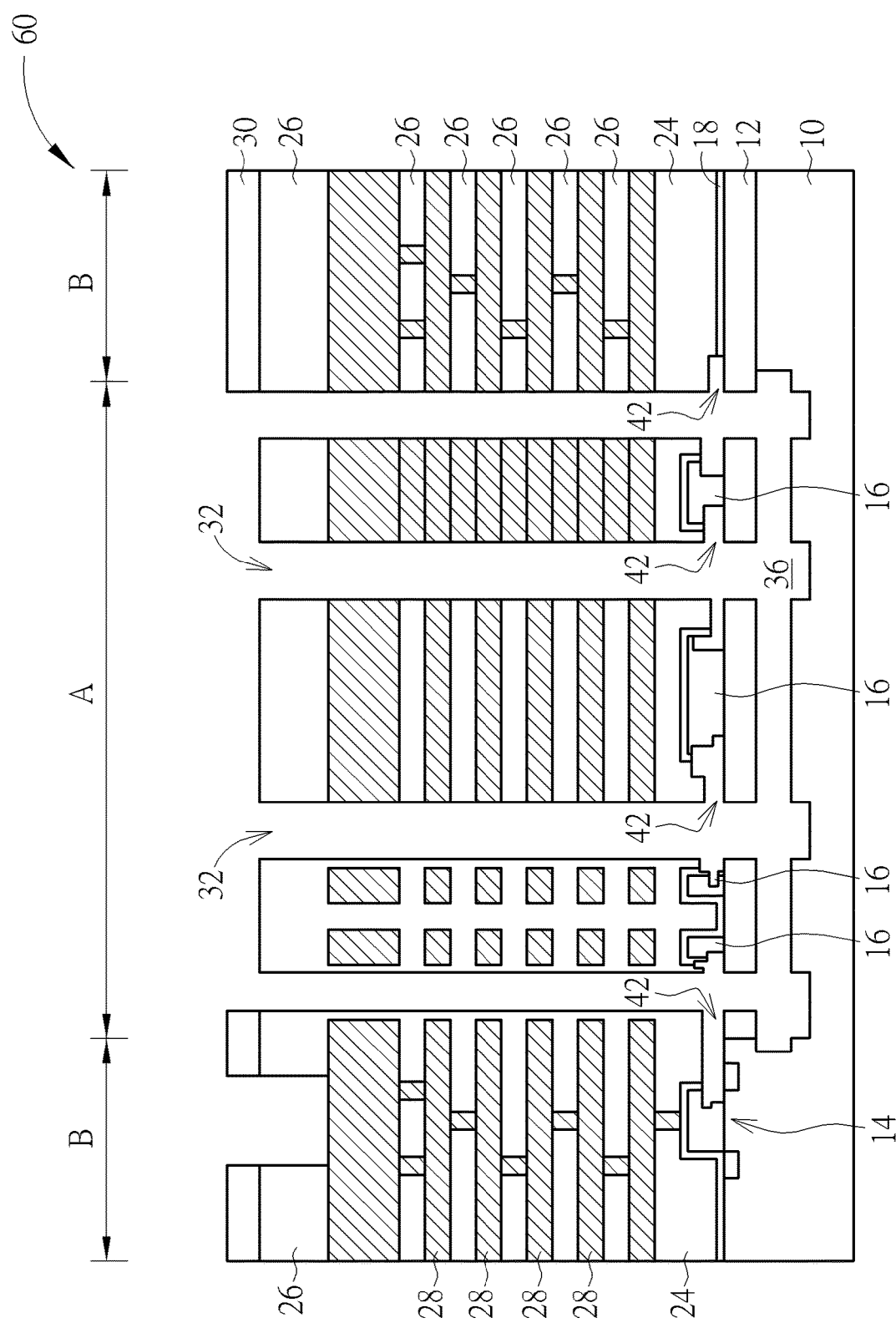
FIG. 7 depicts a method of fabricating a MEMS structure according to a second preferred embodiment of the present invention

FIG. 7 depicts a method of fabricating a MEMS structure according to a second preferred embodiment of the present invention, wherein elements which are substantially the same as those in the first preferred embodiment are denoted by the same reference numerals; an accompanying explanation is therefore omitted. The difference between the second preferred embodiment and the first preferred embodiment is that there is no shrinking region formed in the second preferred embodiment.

As shown in FIG. 7, the etching stop layer 18 is silicon nitride, and no shrinking region 22 is formed. Because sulfur hexafluoride not only etches silicon substrate but also etches silicon nitride, when etching the substrate 10 to form the chamber 36, the sulfur hexafluoride also etches the etching stop layer 18. The region which is originally the etching stop layer 18 becomes a gap 42. After the etching stop layer 18 is etched, the substrate 10 and elements comprising silicon are further etched by sulfur hexafluoride. For example, polysilicon gate or MEMS elements 16 may be etched by the sulfur hexafluoride. This will influence functions of the MEMS structure 60 and, as the gap 42 may deteriorate the structural stability of the MEMS structure 60, the MEMS structure 60 may collapse. As a result, if the method in the second preferred embodiment is used, the etchant and the material of the etching stop layer 18 should be adjusted.

In the first preferred embodiment, part of the nitrogen-containing material layer within the etching stop layer 18 is removed to form a shrinking region 22. When the substrate 10 is etched by sulfur hexafluoride, sulfur hexafluoride only contacts but will not etch the dielectric layer 24, as it is made of silicon oxide. In this way, the etching stop layer 18 and the elements comprising silicon embedded in the dielectric layer 24 will not be removed unexpectedly.

FIG. 6 depicts a MEMS structure formed by a method illustrated in the first preferred embodiment. As shown in FIG. 6, a MEMS structure 50 includes a substrate 10 comprising a MEMS region A and two logic element regions B. At least one logic element 14 such as a transistor is disposed within one of the logic regions B. At least one MEMS element 16 is disposed within the MEMS region A. There are four MEMS elements 16 shown in FIG. 6, but the number of the MEMS element 16 can be adjusted according to the requirements of the products. The substrate 10 may be a bulk silicon substrate, a germanium substrate, a gallium arsenide substrate, a silicon germanium substrate, an indium phosphide substrate, a gallium nitride substrate, a silicon carbide substrate or other semiconductive substrates. In this embodiment, the substrate 10 is preferably silicon substrate. An STI 12 may be disposed on the substrate 10 within the MEMS region A. The STI 12 may extend into the logic element region B. The transistor may include a polysilicon gate electrode. The MEMS element 16 may include polysilicon. In addition, an etching stop layer 18 covers the logic element 14, the MEMS element 16, the MEMS region A, and logic element regions B. The etching stop layer 18 is preferably a single layer structure such as a single layer of a nitrogen-containing material layer such as silicon nitride. The etching stop layer 18 may be other nitrogen-containing material layer such as silicon oxynitride. Moreover, the etching stop layer 18 can be multiple material layers including at least one nitrogen-containing material layer. For example, the etching stop layer 18 may be a combination of silicon nitride and silicon oxide. Moreover, there may be stress in the etching stop layer 18 which can be imparted to material layers below. In this embodiment, the etching stop layer 18 takes a single layer structure as an example. FIG. 5A depicts a top view of relative positions of an etching stop layer 18, a shrinking region 22 and a releasing hole 32 illustrated in FIG. 5B and FIG. 6. It is noteworthy that the shrinking region 22 is defined in the etching stop layer 18. There is no nitrogen-containing material layer inside the shrinking region 22. Specifically, if the etching stop layer 18 is a single layer structure such as a single layer of silicon nitride, there is no etching stop layer 18 within the shrinking region 22. If the etching stop layer 18 is a multi-layered structure formed by a combination of a nitrogen-containing material layer and a non-nitrogen-containing material layer (for example, a combination of silicon nitride and silicon oxide), a non-nitrogen-containing material layer such as silicon oxide will remain in the shrinking region 22. A dielectric layer 24, numerous inter-metal dielectric layers 26 and numerous metal circuits 28 cover the MEMS region A and the logic element regions B. The dielectric layer 24 fills up the shrinking region 22. The metal circuits 28 are disposed within the dielectric layer 24 and the inter-metal dielectric layer 26. At least a releasing hole 32 is within the inter-metal dielectric layers 26, the metal circuits 28 and the dielectric layer 24. The number of the releasing hole 32 may be four as shown in FIG. 5A and FIG. 5B; however, based on different requirements, the number of the releasing hole 32 can be altered.

As shown in FIG. 5A and FIG. 6, the shrinking region 22 surrounds and overlaps the releasing hole 32. In detail, the releasing hole 32 includes an end 34 disposed in the dielectric layer 24 filling the shrinking region 22. The end 34 is entirely within the shrinking region 22. The end 34 is further surrounded by the part of the shrinking region 22 which is not overlapped by the end 34. The end 34 is aligned with a horizontal extension of the top surface of the substrate 10. The end 34 is marked by dotted lines in FIG. 6. For the sake of clarity, there is only one end 34 shown in FIG. 6. The releasing hole 32 is above the dotted line and a chamber 36 is below the dotted line. As shown in FIG. 5A, the end 34 is entirely inside the shrinking region 22. That is, the shrinking region 22 is greater than the end 34. Preferably, there is 0.5 to 1.5 micro meters between the edge of the shrinking region 22 and the end 34. The end 34 includes a sidewall 321. There is no nitrogen-containing material layer exposed through the sidewall 321.

Please refer to FIG. 6 again. The chamber 36 is disposed inside the substrate 10 and within the MEMS region A. If there are numerous releasing holes 32, the chamber 36 connects to all releasing holes 32. The chamber 36 and the releasing hole 32 comprise a vibration chamber 38. It is noteworthy that there is no solid material inside the vibration chamber 38. In addition, a protective layer 30 can be optionally disposed on the topmost inter-metal dielectric layer 26. The protective layer 30 includes at least two openings 44/46. The opening 44 exposes the releasing hole 32. The other opening 46 exposes the metal circuits 28. The MEMS structure 50 can further include a cap layer 40 disposed within the MEMS region A on the substrate 10 to cover the releasing hole 32 and the chamber 36 for preventing pollutants from falling into the releasing hole 32 and the chamber 36.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a MEMS structure comprising:
providing a substrate comprising a logic element region and a MEMS region;
forming a logic element within the logic element region;
forming a nitrogen-containing material layer covering the logic element region and the MEMS region;
removing part of the nitrogen-containing material layer within the MEMS region to form at least one shrinking region recessed into the nitrogen-containing material layer;
forming a dielectric layer to cover the logic element region and the MEMS region, wherein the dielectric layer fills in the shrinking region;
etching the dielectric layer without etching the nitrogen-containing material layer to form at least one releasing hole penetrating the dielectric layer entirely, reaching a top surface of the substrate and overlapping the shrinking region, wherein the shrinking region surrounds the releasing hole; and
etching the substrate to form a chamber, wherein the chamber and the releasing hole form a vibration chamber.

2. The method of fabricating a MEMS structure of claim 1, wherein the nitrogen-containing material layer is silicon nitride, and the nitrogen-containing material layer serves as an etching stop layer.

3. The method of fabricating a MEMS structure of claim 1, wherein the logic element is a transistor, and the transistor comprises a polysilicon gate electrode.

4. The method of fabricating a MEMS structure of claim 1, wherein the releasing hole comprises an end disposed within the dielectric layer inside the shrinking region, and the end is entirely within the shrinking region.

5. The method of fabricating a MEMS structure of claim 4, wherein part of the shrinking region overlaps the end, and part of the shrinking region surrounds the end.

6. The method of fabricating a MEMS structure of claim 1, wherein the substrate is a silicon substrate and the chamber is formed by etching the substrate with a deep reactive ion etching process.

7. The method of fabricating a MEMS structure of claim 1, further comprising:
    before forming the releasing hole, forming at least one inter-metal dielectric layer and at least one metal circuit within the logic element region and the MEMS region; and
    etching the inter-metal dielectric layer, the metal circuit, and the dielectric layer within the MEMS region to form the releasing hole.

8. The method of fabricating a MEMS structure of claim 1, wherein there is no solid material inside the vibration chamber.

9. The method of fabricating a MEMS structure of claim 1, wherein an STI is disposed in the substrate within the MEMS region.

10. The method of fabricating a MEMS structure of claim 1, wherein the releasing hole is formed before the chamber.

* * * * *